United States Patent [19]

Hoeberechts

[11] Patent Number: 4,857,980
[45] Date of Patent: Aug. 15, 1989

[54] RADIATION-SENSITIVE SEMICONDUCTOR DEVICE WITH ACTIVE SCREENING DIODE

[75] Inventor: Arthur M. E. Hoeberechts, Eindhoven, Netherlands

[73] Assignee: U.S. Philips Corp., New York, N.Y.

[21] Appl. No.: 148,512

[22] Filed: Jan. 26, 1988

[30] Foreign Application Priority Data

Feb. 16, 1987 [NL] Netherlands ............... 8700370

[51] Int. Cl.$^4$ ............................................ H01L 27/14
[52] U.S. Cl. ........................................ 357/30; 357/55; 357/20
[58] Field of Search ................ 357/30 D, 30 P, 30 L, 357/30 G, 30 R, 55, 20

[56] References Cited

U.S. PATENT DOCUMENTS

| | | | |
|---|---|---|---|
| 3,081,418 | 3/1963 | Manintveld et al. | 357/30 P X |
| 3,296,502 | 1/1967 | Gross et al. | 357/55 X |
| 3,716,429 | 2/1973 | Napoli et al. | 357/55 X |
| 3,794,891 | 2/1974 | Takamiya | 357/30 P X |

FOREIGN PATENT DOCUMENTS 2284989 9/1976 France .
54-107375 8/1979 Japan ..................... 357/30 D Primary Examiner—Rolf Hille
Assistant Examiner—William Mintel
Attorney, Agent, or Firm—Steven R. Biren

[57] ABSTRACT

A radiation-sensitive semiconductor device has a high-ohmic semiconductor wafer with a thicker edge portion and a thinner central portion, in which a photodiode is located. The surface opposite to the photodiode is provided with a highly-doped contact layer, on which a metal layer is provided. The central portion is so thin that at a low photodiode voltage the depletion zone of the photodiode extends as far as the contact layer. According to the invention, the device includes an active screening diode, which extends both in the edge portion and in the central portion and whose depletion zone extends in the operating condition in the central portion as far as the contact layer. As a result, diffusion of charge carriers from the edge portion to the photodiode is avoided.

9 Claims, 1 Drawing Sheet

RADIATION-SENSITIVE SEMICONDUCTOR DEVICE WITH ACTIVE SCREENING DIODE

BACKGROUND OF THE INVENTION

The invention relates to a radiation-sensitive semiconductor device comprising a semiconductor body in the form of a wafer having a thicker edge portion and a thinner central portion provided with a substantially flat first surface and an oppositely-arranged second surface extending substantially parallel to the first surface. The device includes a high-ohmic first region of a first conductivity type adjoining the first surface, a second region of the second opposite conductivity type which is arranged within the central portion, adjoins the first surface and forms with the first region a photodiode comprising a radiation-sensitive pn junction and is entirely surrounded by the first region within the semiconductor body, as well as a highly doped contact layer of the first conductivity type adjoining the second surface and the first region, a metal layer being formed on at least a part of the second surface, and the metal layer and the second region being provided with connection conductors, while the central portion of the semiconductor body is so thin that it is depleted at least as far as the contact layer when a voltage of less than 10 V is applied in the reverse direction across the pn junction.

The invention further relates to a method of manufacturing such a semiconductor device.

A semiconductor device of the kind described is known from the french Patent Application published under No. 2284989.

Semiconductor devices comprising photodiodes are known and are used in radiation-sensitive circuit arrangements of different kinds, for example, for optical communication, for optically recording and reading information and for various computer applications. In most cases, it is of major importance that the photodiode is fast, i.e. can follow variations of radiation intensity having a very high frequency (>500 MHz).

Another important requirement is that in many cases it is desirable and even necessary that the photodiode can operate at low voltages of, for example, less than 5 V.

In order to obtain a fast photodiode, the diode capacitance should be low, which can be achieved if the diode is formed on semiconductor material of very high resistivity; However, it has been found that in most cases a slow component also occurs, which is due to diffusion of generated charge carriers from the substrate. More particularly, with high-ohmic material, in which the life of minority charge carriers is generally long, this diffusion can take place from parts located at a comparatively great depth. In the semiconductor device according to the aforementioned French Patent Application No. 2284989, the central portion is thin-etched so that this portion is already fully depleted already at a low voltage across the photodiode. Thus, a photodiode operating at a low voltage is obtained, in which in the thin central portion only the this contact layer adjoining the second surface can contribute to the aforementioned slow signal component. However, parasitic charge carriers can also diffuse to the surroundings of the photodiode form the thicker non-depleted edge portions of the wafer and thus can nevertheless give rise to a significant slow component.

SUMMARY OF THE INVENTION

The invention has inter alia for its object to provide a radiation-sensitive semiconductor device comprising a fast photodiode which has a high sensitivity, operates at a low voltage and is mechanically strong.

According to the invention, a radiation-sensitive semiconductor device of the kind described above is characterized in that the metal layer is reflecting for the radiation to be detected and in that a screening diode adjoining the first surface is provided, which entirely surrounds the second region within the central portion, extends into the thicker edge portion and is entirely surrounded by the first region within the semiconductor body, the screening diode forming with the first region a rectifying junction and being provided with a connection conductor for applying across the screening diode such a voltage in the reverse direction that the depletion zone thus formed extends in the central portion at least as far as the contact layer.

Due to the fact that the depletion zone starting from the screening diode entirely depletes the edge of the central portion of the semiconductor wafer as far as the highly doped contact layer, this central portion is practically insulated electrically from the edge portion. As a result, the charge carriers generated in the central portion by radiation not incident upon the photodiode and also those charge carriers which are generated (optically or thermally) in the high-ohmic edge portion of the wafer and diffuse towards the photodiode, are drained via the screening diode, except for a very small part which can diffuse via the contact layer. The said slow signal component is then consequently practically eliminated. Due to the high-ohmic material used, the capacitance of the photodiode is low, which leads to an increase in speed. Moreover, the depletion of the central portion is attained at a very low voltage (with the use of n-type silicon of 100 Ωcm and a thickness of 10 μm for the central portion for example only 2 V). The metal layer on the second surface ensures a high sensitivity by reflection of the incident radiation.

The screening diode can comprise a metal layer which forms a rectifying junction with the first region. According to a preferred embodiment, the screening diode forms with the first region a pn junction, which can then advantageously be formed simultaneously with the radiation-sensitive pn junction of the photodide.

Preferably, the screening diode covers substantially the whole edge portion and the major port of the central portion of the semiconductor body. Further, the distance between the radiation-sensitive pn junction and the screening diode is preferably so small that in the operating condition the depletion zones associated with the screening diode and with the photodiode touch each other or even overlap each other under the influence of the then prevailing operating voltages. Under these conditions, diffusion of parasitic charge carriers is counteracted as effectively as possible.

The radiation may be incident upon the first surface or upon the second surface. In the latter case, the reflecting metal layer is provided with an opening serving as a window for the incident radiation.

The semiconductor body may consist of a semiconductor element, such as silicon or germanium, or of a semiconductor compound, for example a III–V compound, such as gallium arsenide. However, the semiconductor body preferably consists of silicon and the first region has a doping concentration of at least $10^{11}$ and at most $10^{13}$ atoms per $cm^3$. Preferably, the first region consists of n-type conducting silicon having a resistivity of at least 1000 $\Omega cm$.

The thickness of the central portion of the body will then generally be at most 200 $\mu m$ in order to keep the operating voltage low. Preferably, the thickness of the central portion will not exceed approximately 10 $\mu m$.

BRIEF DESCRIPTION OF THE DRAWING

The invention will now be described more fully with reference to several embodiments and the drawing, in which.

The Figures are purely schematic and are not drawn to scale. Semiconductor regions of the same conductivity type are cross-hatched in the same direction. In the plan view of FIG. 2, the metallization is indicated by hatched lines.

DESCRIPTION OF THE PREFERRED EMBODIMENTS

Figure 1:
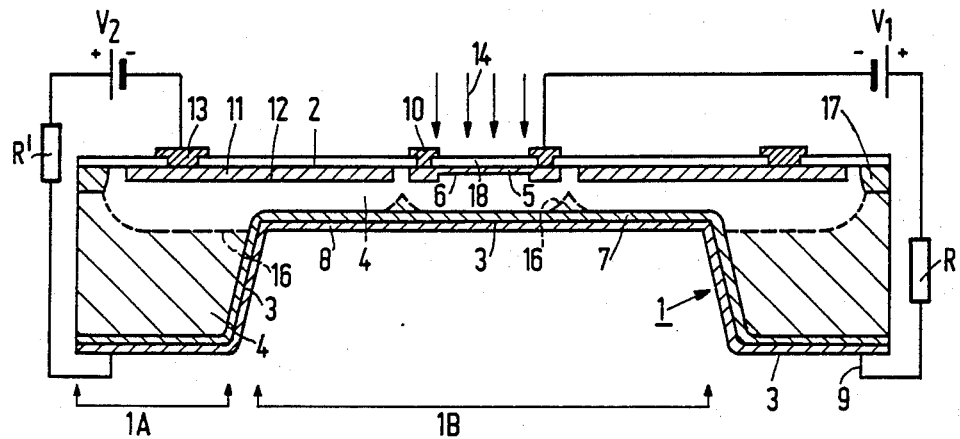
FIG. 1 shows diagrammatically in cross-section a semiconductor device according to the invention taken on the line I—I of FIG. 2.
Figure 2:
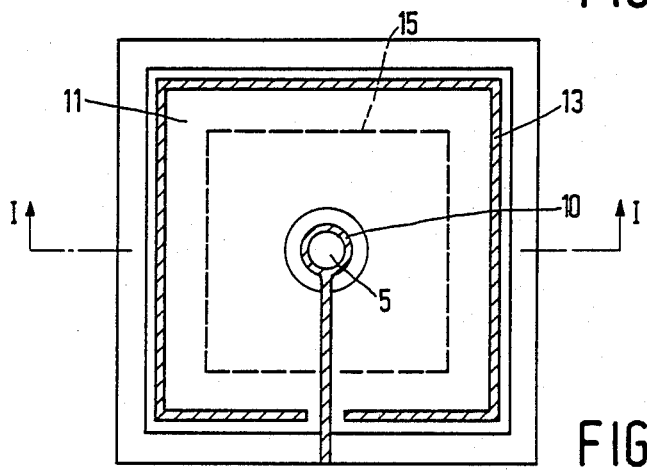
FIG. 2 shows diagrammatically in plan view the semiconductor device of FIG. 1.

FIG. 1 shows diagrammatically in cross-section and FIG. 2 shows in plan view a radiation-sensitive semiconductor device according to the invention. The device comprises a semiconductor body 1 of silicon in the form of a wafer having a thicker edge portion 1A and a thiner central portion 1B. The wafer has a practically flat first surface 2 and an oppositely arranged second surface 3 extending substantially parallel to the first surface 2. In the plan view of FIG. 2, the boundary between the parts 1A and 1B is indicated by a dotted line 15.

The device comprises a high-ohmic first region 4 of a first conductivity type, in this embodiment an n-type conducting region having a resistivity of 1000 $\Omega cm$, which adjoins the first surface 2. Further, the device comprises a second region 5 of the second, opposite conductivity type, in this embodiment of the p conductivity type, which is located within the central portion B and adjoins the first surface 2. The region 5 forms with the first region 4 a photodiode comprising a radiation-sensitive pn junction 6; the region 5 is surrounded entirely by the first region 4 within the semiconductor body. The device further comprises a highly doped contact layer 7 of the first, so in this case n, conductivity type adjoining the second surface 3 and the first region 4. A metal layer 8 is provided on at least a part of the second surface 3, in this case on the whole surface. The metal layer 8 and the second region 5 are provided with connection conductors 9 and 10. The central portion 1B of the semiconductor body is so thin that it is depleted at least as far as the contact layer 7 when a reverse voltage $V_1$ of less than 10 V is applied across the pn junction 6. The signal is measured across an impedance R.

A radiation-sensitive device as described thus far is known from the aforementioned French Patent Application published under No. 2284989.

According to the invention, the metal layer 8 is reflecting for the radiation to be detected and the device is provided with a screening diode 11, which adjoins the first surface 2, entirely surrounds the second region 5 within the central portion 1B, extends into the thicker edge portion 1A and is surrounded entirely by the first region 4 within the semiconductor body. In this embodiment, the screening diode is constituted by a p-type conducting zone 11, which forms a pn junction 12 with the first region 4. The screening diode covers substantially the whole surface of the edge portion 1A of the wafer. The screening diode 11 is further provided with a connection conductor 13 for applying across the screening diode such a voltage $V_2$ in the reverse direction that the depletion zone thus formed extends in the central portion 1B at least as far as the contact layer 7.

In the semiconductor device according to this embodiment, the radiation is incident upon the surface 2 in the direction of the arrows 14.

In the operating condition, the situation is that indicated in FIG. 1. The depletion zones of the screening diode 11 and of the photodiode 5 are indicated by the non-cross-hatched part of the region 4 bounded by a dotted line 16. The depletion zone insulates the central portion 1B electrically from the undepleted part of the thicker edge portion 1A, from which no charge carriers can diffuse to the central portion 1B other than via the thin contact layer 7. Thus, the aforementioned slow signal component is practically avoided in the semiconductor device according to the invention, the more so as the diffusion length of charge carriers is small in the very highly doped ($>10^{20} cm^{-3}$) contact layer 7.

A further advantage of the invention is that radiation incident outside the central portion does not influence the operation of the diode, scattered light and other undesired light only produces a current in the circuit in which $V_2$ is included. Detection of this current via an impedance R' may be used, for example, to align the fiber, from whcih the light 14 emanates, to the central portion. The signal measured via the central diode across the impedance R is than a maximum and at the same time the signal measured across R' is a minimum. In general, R' is therefore a temporarily present impedance for adjusting the device.

In this embodiment, the first region 4 consists of n-type silicon having a resistivity of 1000 $\Omega . cm$, i.e. a doping concentration of about 4.6 $10^{12}$ atoms per $cm^3$. The edge portion 1A has a thickness of 385 $\mu m$; the central portion 1B has a thickness of 10 $\mu m$. The second region 5 constituting the photodiode has a thickness of 0.2 $\mu m$ and in this embodiment has a 0.8 $\mu m$ thick edge at the area of the annular contact 10. The zone 11 constituting the screening diode has a thickness of 0.8 $\mu m$. In order to obtain a better definition of the potential variation at the outer edge of the region 12, an $n^+$ conducting zone 17 is provided along this edge. The n-type contact layer 7 has a thickness of about 1 $\mu m$.

Under these conditions, the central portion 1B is entirely depleted at voltages of at least 2 V across both the photodiode and the screening diode.

The semiconductor device of the embodiment described can be manufactured in the following manner. The starting material is a (100) orientated n-type silicon wafer having a resistivity of 1000 $\Omega cm$ and a thickness of about 400 $\mu m$. This wafer is thermally oxidized and channels are then etched at a surface into the oxide 18 by means of known photolithographic techniques between the separate devices to be formed on the silicon wafer. The thickness of the oxide 18 is chosen so that with any further silicon nitride layer to be applied or any other coating at least on the central portion of the device the transmission for the light used is an optimum. For forming the said zones 17, a heavy phosphorus diffusion is provided in these channels. However, this is not necessary.

Subsequently, the regions 5 an 11 are formed in a known manner in the same surface by ion implantation. If desired, these regions may be formed in a single step, but in connection with the smaller depth of the active part of the photodiode two implantation steps are used in this embodiment. The diameter of the photodiode is in this case 100 $\mu$m; the distance between the zones 5 and 11 is 10 $\mu$m. After implantation and a diffusion step, a silicon nitride layer having a thickness of 1 $\mu$m is deposited on the silicon wafer as a mask. Subsequently, a square region of 800 × 800 $\mu$m$^2$ is exposed on the back side of the wafer and the silicon is etched selectively for about 10 hours in a solution of KOH and propanel in water in order to obtain the desired thickness of the central portion 1B. The central portion is then bounded by (111) surfaces at an angle of about 57°.

Subsequently, the silicon nitride is removed and the silicon wafer is subjected to a phosphorus diffusion, the contact layer 7 then being formed. This phosphorus deposition at the same time serves as a gettering step.

The required contact windows are then etched and the metallization is provided in the usual manner. For this purpose, an aluminum silicon layer containing about 1 % of silicon is used in this embodiment. The assembly is then provided in a suitable envelope.

In the present embodiment, the screening diode is constituted by a p-type zone 11. Instead thereof, a Schottky diode could also be used, which may be constituted by a suitable metal forming a rectifying junction with the weakly n-type conducting region 4.

Figure 3:
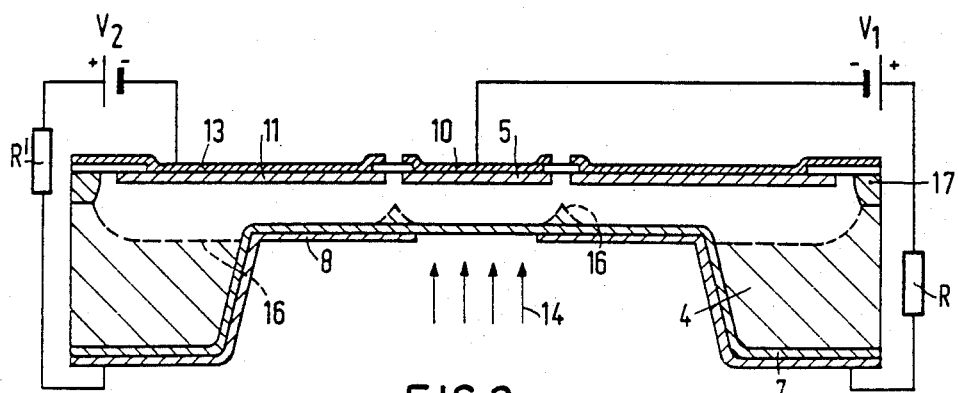
FIG. 3 shows diagrammatically in cross-section another embodiment of the semiconductor device according to the invention.

Instead of being incident upon the surface 2, at which the photodiode is situated, the radiation 14 may also be incident upon the opposite surface 3. The metal layer 8 disposed thereon must then have an opening serving as an entrance window and if desired, an anti-reflection coating of, for example, silicon monoxide may be provided therein (not shown here). The situation then becomes that shown in FIG. 3, while in the n-type contact layer also an opening may be provided at the area of this window in order to avoid unnecessary recombination. The other surface 2 is then coated over a largest possible part with reflecting metal (10, 13) in order that the maximum number of photons can be converted into charge carriers. In the case in which radiation incident from both sides has to be detected, an entrance window may be provided both in the metal layer 8 and in the metal layer 10.

The invention is not limited to the embodiments described above. For example, the dimensions of the various semiconductor zones and regions may be varied within wide limits on the understanding that the depletion zone of the screening diode should extend both within the thinner central portion and within the thicker edge portion. Other semiconductor materials and other reflecting metals may also be used, while the thickness of the various regions and layers may also be chosen differently.

What is claimed is:

1. A radiation-sensitive semiconductor device comprising a semiconductor body in the form of a wafer having a relatively thicker edge portion and central portion thinner than said edge portion provided with a substantially flat first surface and an oppositely-arranged second surface having a central portion extending substantially parallel to the first surface, said device comprising a relatively high-ohmic first region of a first conductivity type adjoining the first surface, a second region of the second, opposite, conductivity type, which adjoins the first surface, which forms with the first region a photodiode comprising a radiation-sensitive p-n junction and which is entirely surrounded by the first region within the semiconductor body, and a relatively highly-doped contact layer of the first conductivity type which adjoins the second surface and the first region, a metal layer being provided on at least a part of the second surface, the metal layer and the second region being provided with connection conductors, the central portion of the semiconductor body being so thin that, in operation, it is depleted as far as the contact layer when a voltage of less than 10 V is applied in the reverse direction across said p-n junction, characterized in that the metal layer is reflecting for the radiation to be detected and in that a screening diode is provided partly in the central portion and partly in the edge portion, which diode adjoins the first surface, entirely surrounds but does not contact the second region within the central portion, extends into the relatively thicker edge portion and is entirety surrounded by the first region within the semiconductor body, said screening diode forming with the first region a rectifying ju.ction and being provided with a connection conductor for applying across the screening diode such a voltage in the reverse direction that the depletion zone thus formed extends in the central portion at least as far as the contact layer.

2. A semiconductor device as claimed in claim 1, characterized in that the screening diode covers substantially the whole edge portion and the major part of the central portion of the semiconductor body.

3. A semiconductor device as claimed in claim 1 or 2, characterized in that the distance between the radiation-sensitive p—n junction and the screening diode is so small that in the operating condition the associated depletion zones touch each other.

4. A semiconductor device as claimed in claim 1 or 2, characterized in that the screening diode forms a p—n junction with the first region.

5. A semiconductor device as claimed in claim 1 or 2, characterized in that the metal layer is provided opposite to the radiation-sensitive p—n junction with an opening serving as a window for incident radiation.

6. A semiconductor device as claimed in claim 5, characterized in that the first region comprises of silicon and has a doping concentration of at least $10^{11}$ and at most $10^{13}$ atoms per cm$^3$.

7. A semiconductor device as claimed in claim 6, characterized in that the first region is n-type conducting and has a resistivity of at least 1000 $\Omega$cm.

8. A semiconductor device as claimed in claim 1 or 2, characterized in that the thickness of the central portion of the semiconductor body is at most about 20 $\mu$m.

9. A semiconductor device as claimed in claim 1 or 2, characterized in that the thickness of the central portion of the semiconductor body is at most about 10 $\mu$m.

* * * * *